(12) United States Patent
Sakaue et al.

(10) Patent No.: US 10,788,660 B2
(45) Date of Patent: Sep. 29, 2020

(54) OPTICAL SCANNING DEVICE AND HEAD-UP DISPLAY

(71) Applicants: Yoichi Sakaue, Tokyo (JP); Takahiko Nishiyama, Tokyo (JP)

(72) Inventors: Yoichi Sakaue, Tokyo (JP); Takahiko Nishiyama, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 142 days.

(21) Appl. No.: 16/116,163

(22) Filed: Aug. 29, 2018

(65) Prior Publication Data

US 2019/0072757 A1 Mar. 7, 2019

(30) Foreign Application Priority Data

Sep. 5, 2017 (JP) ................. 2017-170054

(51) Int. Cl.
| | |
|---|---|
| G02B 26/08 | (2006.01) |
| G02B 26/10 | (2006.01) |
| H01L 41/04 | (2006.01) |
| H01L 41/047 | (2006.01) |
| H01L 41/113 | (2006.01) |
| G02B 27/01 | (2006.01) |
| H01L 41/09 | (2006.01) |

(52) U.S. Cl.
CPC ....... *G02B 26/101* (2013.01); *G02B 26/0858* (2013.01); *G02B 26/105* (2013.01); *H01L 41/042* (2013.01); *H01L 41/0475* (2013.01); *H01L 41/1132* (2013.01); *G02B 27/0101* (2013.01); *G02B 27/0149* (2013.01); *G02B 27/0172* (2013.01); *G02B 2027/0154* (2013.01); *H01L 41/0933* (2013.01)

(58) Field of Classification Search
CPC ............ G02B 26/101; G02B 26/105; G02B 26/0858; G02B 27/0172; G02B 27/0101; G02B 27/0149; G02B 2027/0154; G02B 27/01; G02B 26/0833; H01L 41/042; H01L 41/0475; H01L 41/1132; H01L 41/0933
See application file for complete search history.

(56) References Cited

U.S. PATENT DOCUMENTS

| | | |
|---|---|---|
| 2003/0133196 A1 | 7/2003 | Wine et al. |
| 2008/0043295 A1* | 2/2008 | Sakakibara ............. B41J 2/473 358/474 |

FOREIGN PATENT DOCUMENTS

JP 2016-118726 6/2016

OTHER PUBLICATIONS

Extended European search report for European Patent Application No. 18192322.8 dated Feb. 19, 2019.

* cited by examiner

*Primary Examiner* — Euncha P Cherry
(74) *Attorney, Agent, or Firm* — IPUSA, PLLC

(57) ABSTRACT

An optical scanning device includes an optical scanner including a mirror that includes a light reflection surface, a driving source that causes the mirror to rotate around a rotation axis passing through the center of the light reflection surface in response to a driving signal, and a piezoelectric sensor that outputs a sensor signal corresponding to a rotational angle of the mirror around the rotation axis; and an impedance conversion circuit that receives the sensor signal from the piezoelectric sensor, performs impedance conversion on the received sensor signal, and outputs the impedance-converted sensor signal.

8 Claims, 16 Drawing Sheets

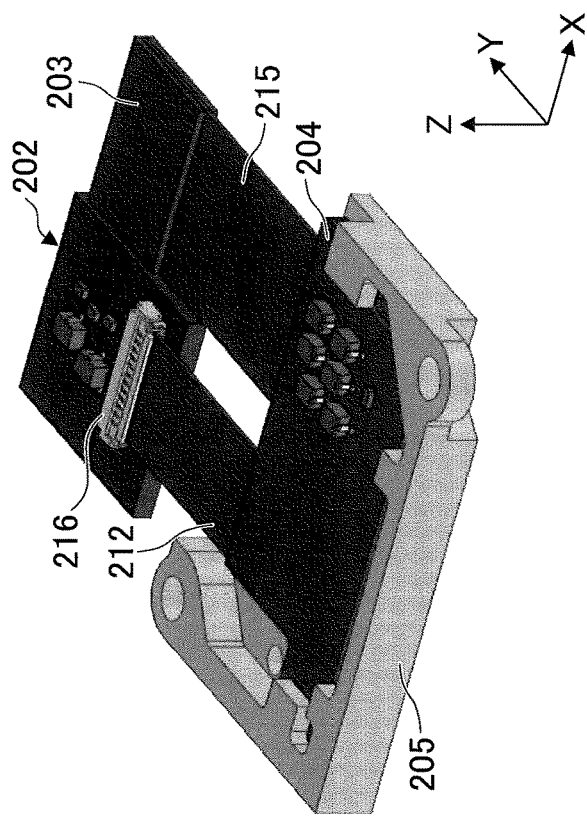
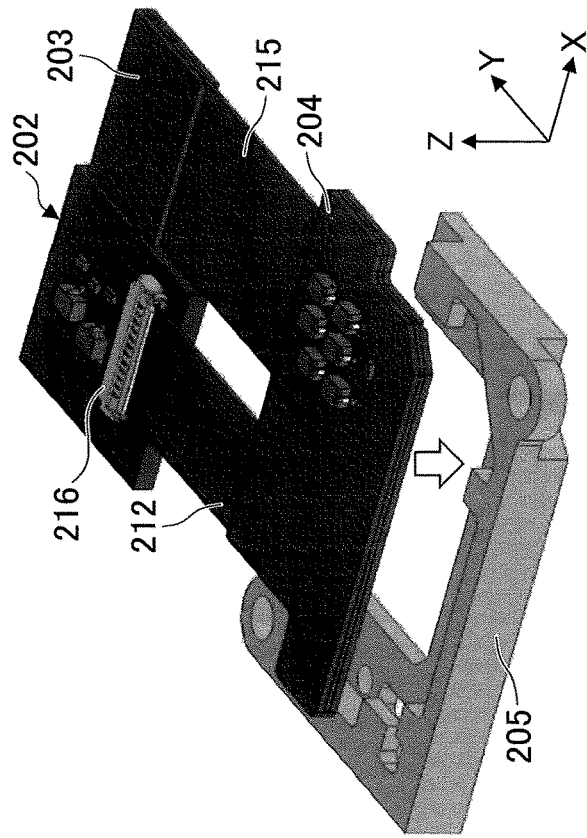
FIG.6A
FIG.6B

OPTICAL SCANNING DEVICE AND HEAD-UP DISPLAY

CROSS-REFERENCE TO RELATED APPLICATION

The present application is based upon and claims the benefit of priority of Japanese Patent Application No. 2017-170054, filed on Sep. 5, 2017, the entire contents of which are incorporated herein by reference.

BACKGROUND OF THE INVENTION

1. Field of the Invention

An aspect of this disclosure relates to an optical scanning device and a head-up display.

2. Description of the Related Art

There is a known optical scanning device that scans light by rotating a mirror around a rotational axis (see, for example, Japanese Laid-Open Patent Publication No. 2016-118726). In the optical scanning device, a driving signal is supplied to a piezoelectric actuator to rotate the mirror around the rotational axis. The optical scanning device also includes a sensor that outputs, as a sensor signal, a voltage with an amplitude corresponding to the rotational angle of the mirror.

In the optical scanning device described above, a sensor signal with a low frequency tends to become weak. If a sensor signal is weak, the sensor signal is influenced by a load of a circuit disposed downstream of the optical scanning device and by disturbance caused by electromagnetic induction between wires, and as a result, the operation of the circuit is influenced.

SUMMARY OF THE INVENTION

In an aspect of this disclosure, there is provided an optical scanning device that includes an optical scanner including a mirror that includes a light reflection surface, a driving source that causes the mirror to rotate around a rotation axis passing through the center of the light reflection surface in response to a driving signal, and a piezoelectric sensor that outputs a sensor signal corresponding to a rotational angle of the mirror around the rotation axis; and an impedance conversion circuit that receives the sensor signal from the piezoelectric sensor, performs impedance conversion on the received sensor signal, and outputs the impedance-converted sensor signal.

BRIEF DESCRIPTION OF THE DRAWINGS

FIGS. 6A and 6B are drawings illustrating how to attach the connecting board to a bottom housing;

DESCRIPTION OF THE PREFERRED EMBODIMENTS

Embodiments of the present invention are described below with reference to the accompanying drawings.

<First Embodiment>

Figure 1:
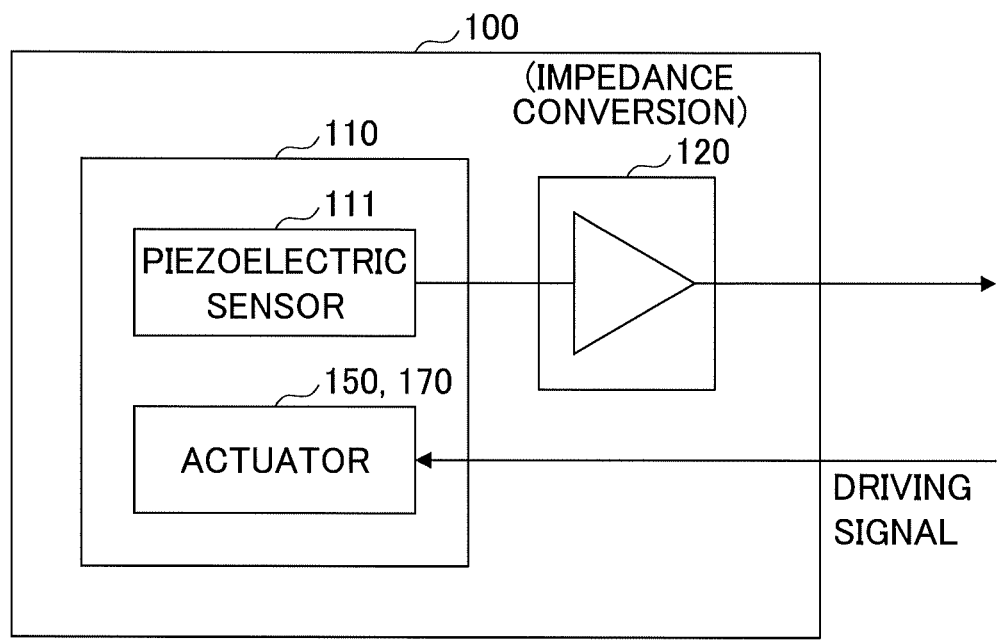
FIG. 1 is a block diagram illustrating an exemplary configuration of an optical scanning device according to a first embodiment.

FIG. 1 is a block diagram illustrating an exemplary configuration of an optical scanning device 100 according to a first embodiment.

The optical scanning device 100 includes an optical scanner (Micro Electro Mechanical Systems (MEMS) device) 110 and an impedance conversion circuit 120.

The optical scanner 110 includes a piezoelectric sensor 111 and actuators 150 and 170. In the optical scanner 110, the actuators 150 and 170 are driven by driving signals supplied from an external device and cause a mirror (described later) to rotate (or oscillate) in horizontal and vertical directions. The piezoelectric sensor 111 outputs a sensor signal (voltage) corresponding to the rotational angle of the mirror in the vertical direction to the impedance conversion circuit 120 disposed downstream of the piezoelectric sensor 111. Details of the optical scanner 110 are described later.

The impedance conversion circuit 120 is implemented by a field-effect transistor (FET) and receives a signal output from the piezoelectric sensor 111. Also, a signal output from the impedance conversion circuit 120 is supplied to a circuit disposed downstream of the optical scanning device 100.

Thus, in the first embodiment, the optical scanning device 100 is implemented as a module including the optical scanner 110 and the impedance conversion circuit 120 disposed downstream of the optical scanner 110, and the impedance conversion circuit 120 supplies an impedance-converted sensor signal to a downstream circuit.

This configuration of the first embodiment makes it possible to prevent the sensor signal from being influenced by a load of a circuit disposed downstream of the optical scanning device 100. The downstream circuit is, for example, a circuit that performs a process using the sensor signal.

In the optical scanning device 100 of the first embodiment, boards are configured such that the sensor signal output from the impedance conversion circuit 120 and the driving signal supplied to the optical scanner 110 are separated from each other. This configuration of the first embodiment makes it possible to prevent the sensor signal from being influenced by disturbance from the driving signal which is caused by electromagnetic induction between wires.

Figure 2:
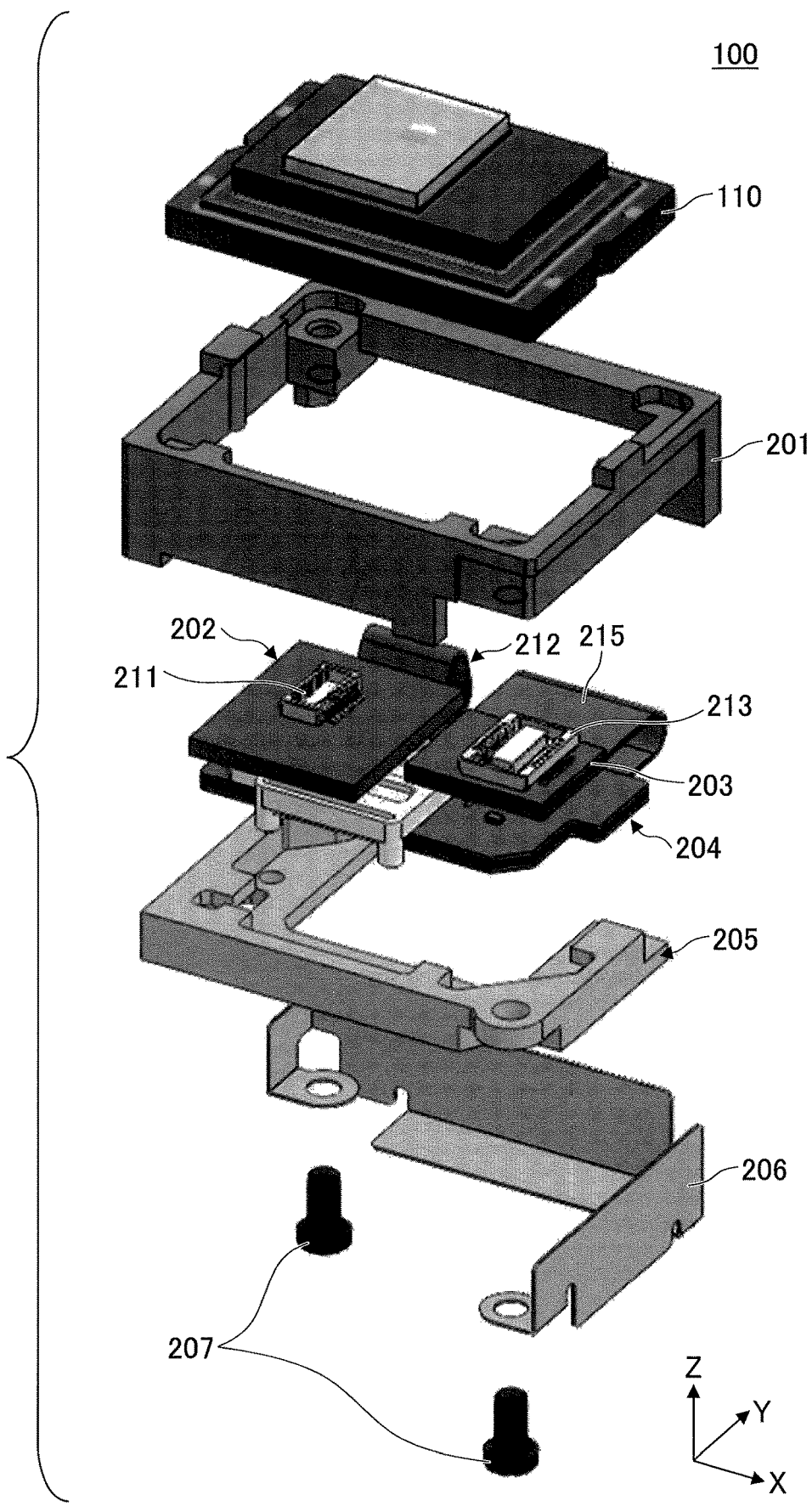
FIG. 2 is an exploded perspective view of the optical scanning device according to the first embodiment.

An exemplary configuration of boards of the optical scanning device 100 of the first embodiment is described below. FIG. 2 is an exploded perspective view of the optical scanning device 100 of the first embodiment.

The optical scanning device 100 includes the optical scanner 110, a top housing 201, an impedance conversion circuit board 202, a connector board 203, a connecting board 204, a bottom housing 205, an exterior plate 206, and screws 207.

The impedance conversion circuit board 202 is comprised of a high humidity resistance material. The impedance conversion circuit 120 is mounted on the impedance conversion circuit board 202. An example of the high humidity resistance material is an epoxy material. The impedance conversion circuit board 202 includes a connector 211 and a cable 212 (first cable).

The connector 211 is for connecting the piezoelectric sensor 111 of the optical scanner 110 to the impedance conversion circuit 120. In other words, the connector 211 is used to input a sensor signal output from the piezoelectric sensor 111 to the impedance conversion circuit 120.

The cable 212 is for connecting the impedance conversion circuit board 202 to the connecting board 204. In other words, the cable 212 is used to input an impedance-converted sensor signal output from the impedance conversion circuit 120 to the connecting board 204.

Thus, the impedance conversion circuit board 202 is a sensor signal wiring board where sensor signal wiring for connecting the impedance conversion circuit 120 to the connector 211 and sensor signal wiring for connecting the connector 211 to the piezoelectric sensor 111 are formed between the connector 211 and the cable 212.

A connector 213 is mounted on the connector board 203. The connector 213 is connected to the actuators 150 and 170 of the optical scanner 110 to supply driving signals to the actuators 150 and 170.

The connector board 203 is connected to the connecting board 204 via a cable 215 (second cable). Thus, the connector board 203 is a driving signal wiring board where driving signal wiring for connecting the connector 213 to the cable 215 is formed.

As described above, in the first embodiment, the impedance conversion circuit board 202 and the connector board 203 are connected to the connecting board 204 so that the wiring for transmitting the sensor signal and the wiring for transmitting the driving signal are separated from each other and the sensor signal and the driving signal are separated from each other.

An exemplary method of assembling the optical scanning device 100 of the first embodiment is described below with reference to FIGS. 3 through 14.

Figure 3:
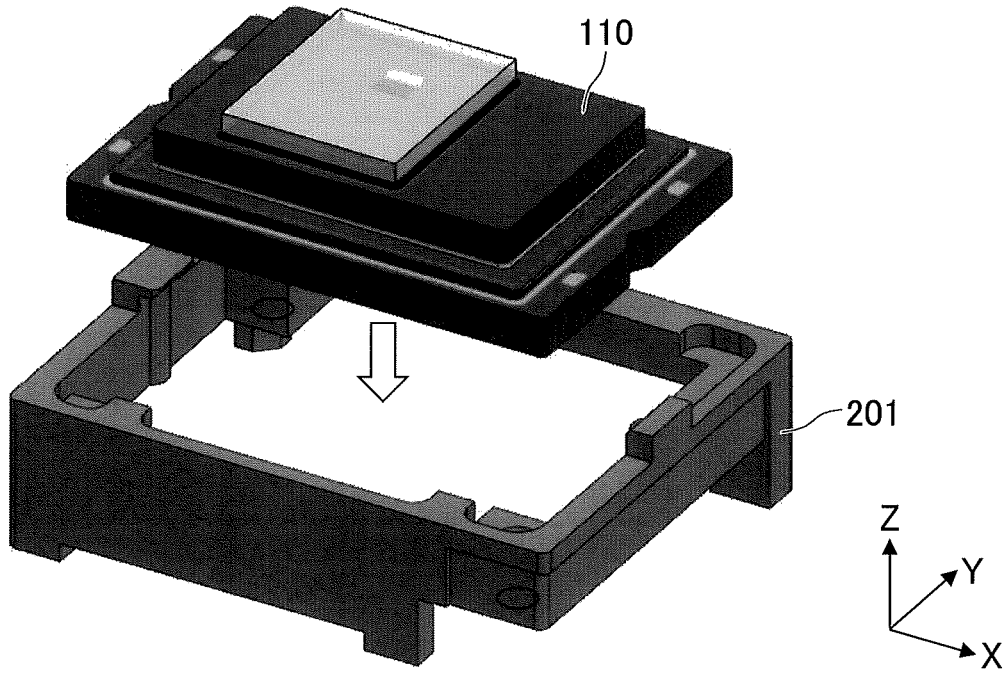
FIG. 3 is a drawing illustrating how to attach a top housing to an optical scanner.
Figure 4:
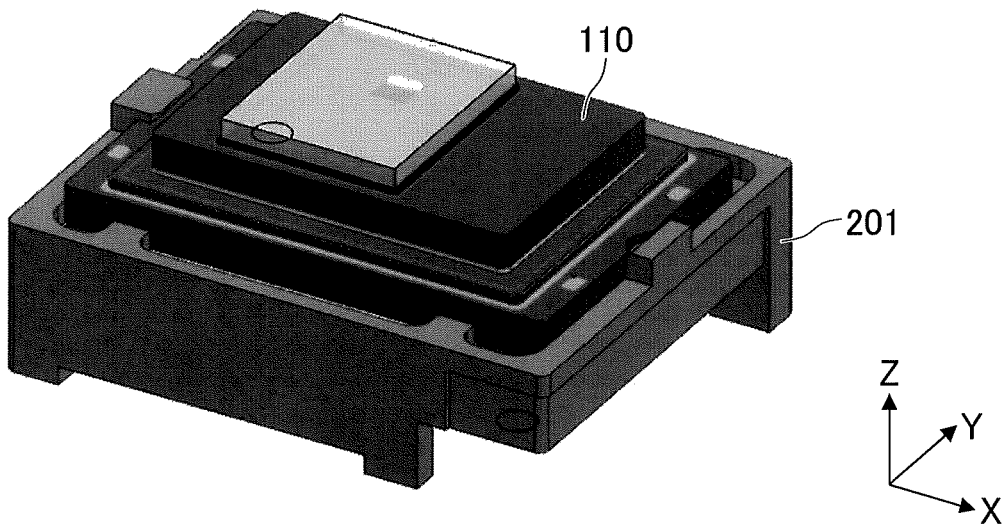
FIG. 4 is a drawing illustrating a state where the top housing is attached to the optical scanner.

FIG. 3 is a drawing illustrating how to attach the top housing 201 to the optical scanner 110, and FIG. 4 is a drawing illustrating a state where the top housing 201 is attached to the optical scanner 110. In FIGS. 3 and 4, the upper side of the optical scanning device 100 faces the +Z direction.

In the first embodiment, the optical scanner 110 is fitted into and connected to the top housing 201. The optical scanner 110 of the first embodiment is provided, for example, as a sealed package where the mirror, the piezoelectric sensor 111, and the actuators 150 and 170 are encapsulated.

Figure 5A:
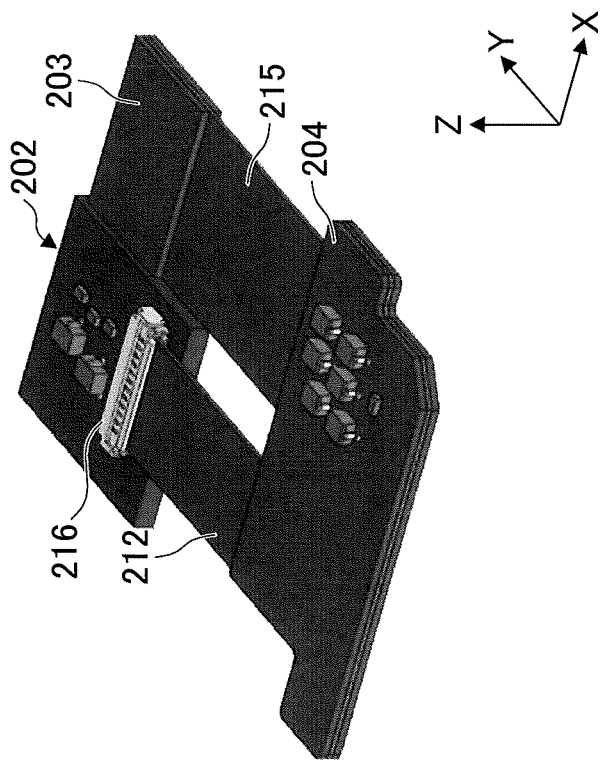
FIGS. 5A and 5B are drawings illustrating how to connect an impedance conversion circuit board to a connecting board.
Figure 5B:
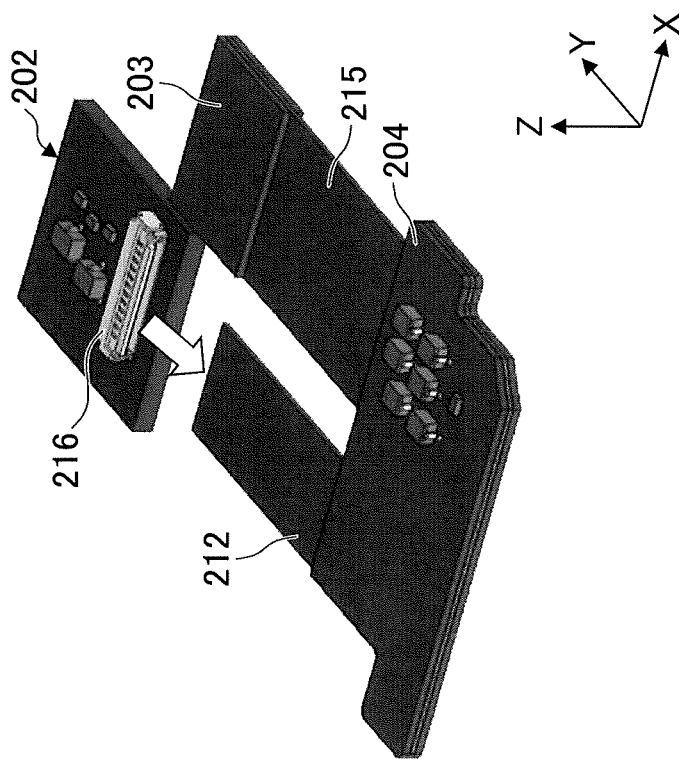

FIGS. 5A and 5B are drawings illustrating how to connect the impedance conversion circuit board 202 to the connecting board 204. FIG. 5A illustrates a state before connection, and FIG. 5B illustrates a state after connection.

A connector 216 is mounted on a surface of the impedance conversion circuit board 202 that is opposite the surface on which the connector 211 is mounted. The connector 216 is for connecting an output terminal of the impedance conversion circuit 120 mounted on the impedance conversion circuit board 202 to the cable 212.

The impedance conversion circuit board 202 is connected to the connecting board 204 by connecting the cable 212 to the connector 216. In other words, with the cable 212 connected to the connector 216, the impedance conversion circuit 120 can output an impedance-converted sensor signal to the connecting board 204.

Thus, in the first embodiment, a sensor signal is transmitted from the impedance conversion circuit board 202 via the cable 212 to the connecting board 204. Also, the connector board 203 is connected via the cable 215 to the connecting board 204. Accordingly, in the first embodiment, a driving signal is transmitted from the connecting board 204 via the cable 215 to the connector board 203.

As described above, in the first embodiment, the impedance conversion circuit board 202 and the connector board 203 are connected via two cables to the connecting board 204 so that a board on which the sensor signal wiring is formed and a board on which the driving signal wiring is formed are separated from each other.

The optical scanner 110 includes, in addition to the piezoelectric sensor 111 (first piezoelectric sensor), a piezoelectric sensor (second piezoelectric sensor) for detecting the rotational angle of the mirror in the horizontal direction (the X-axis direction).

The impedance conversion circuit board 202 of the first embodiment may be configured such that a sensor signal output from the piezoelectric sensor for detecting the rotational angle of the mirror in the horizontal direction is output via the cable 212 to the connecting board 204 without being input to the impedance conversion circuit 120. Details of the piezoelectric sensor for detecting the rotational angle of the mirror in the horizontal direction are described later.

FIGS. 6A and 6B are drawings illustrating how to attach the connecting board 204 to the bottom housing 205. FIG. 6A illustrates a state before the connecting board 204 is attached, and FIG. 6B illustrates a state after the connecting board 204 is attached.

In the first embodiment, after the impedance conversion circuit board 202 is connected to the connecting board 204, the connecting board 204 is fitted into and fixed to the bottom housing 205.

Next, how to connect the impedance conversion circuit board 202 and the connector board 203 to the optical scanner 110 is described with reference to FIGS. 7 through 9.

Figure 7:
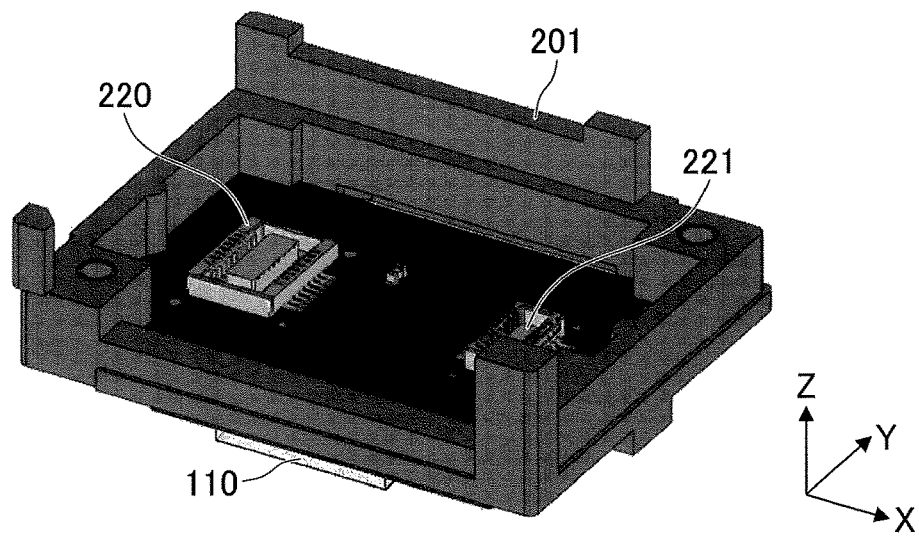
FIG. 7 is a drawing illustrating the optical scanner fixed to the top housing.

FIG. 7 is a drawing illustrating the optical scanner 110 fixed to the top housing 201. FIG. 8 is a drawing illustrating how to connect the impedance conversion circuit board 202 and the connector board 203 to the optical scanner 110. FIG.

9 is a drawing illustrating a state where the impedance conversion circuit board 202 and the connector board 203 are connected to the optical scanner 110.

FIG. 7 illustrates the reverse side of the optical scanner 110 that is fixed to the top housing 201 as illustrated in FIG. 4. Accordingly, in FIG. 7, the upper side of the optical scanning device 100 faces the −Z direction, and the lower side of the optical scanning device 100 faces the +Z direction. In FIGS. 8 through 14, similarly to FIG. 7, the upper side of the optical scanning device 100 faces the −Z direction, and the lower side of the optical scanning device 100 faces the +Z direction.

Connectors 220 and 221 are mounted on the lower surface of the optical scanner 110. The connector 220 is to be connected to the connector 211, and the connector 221 is to be connected to the connector 213.

Figure 8:
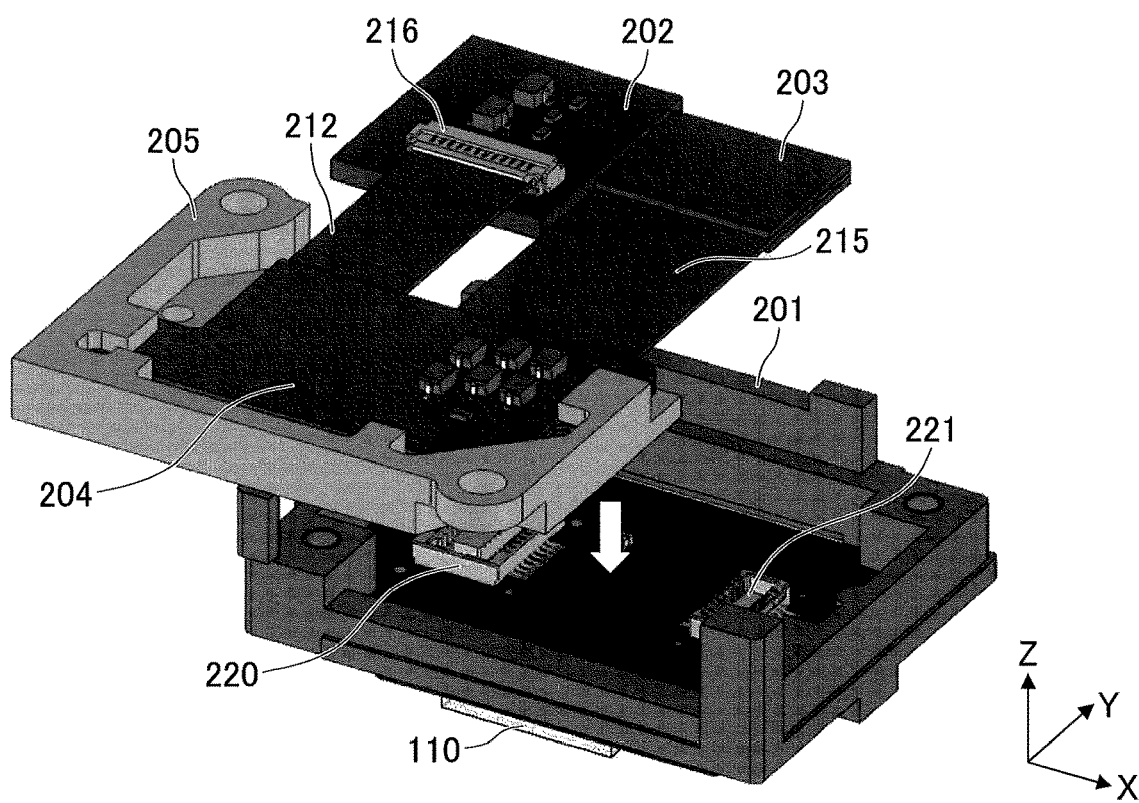
FIG. 8 is a drawing illustrating how to connect the impedance conversion circuit board and a connector board to the optical scanner.
Figure 9:
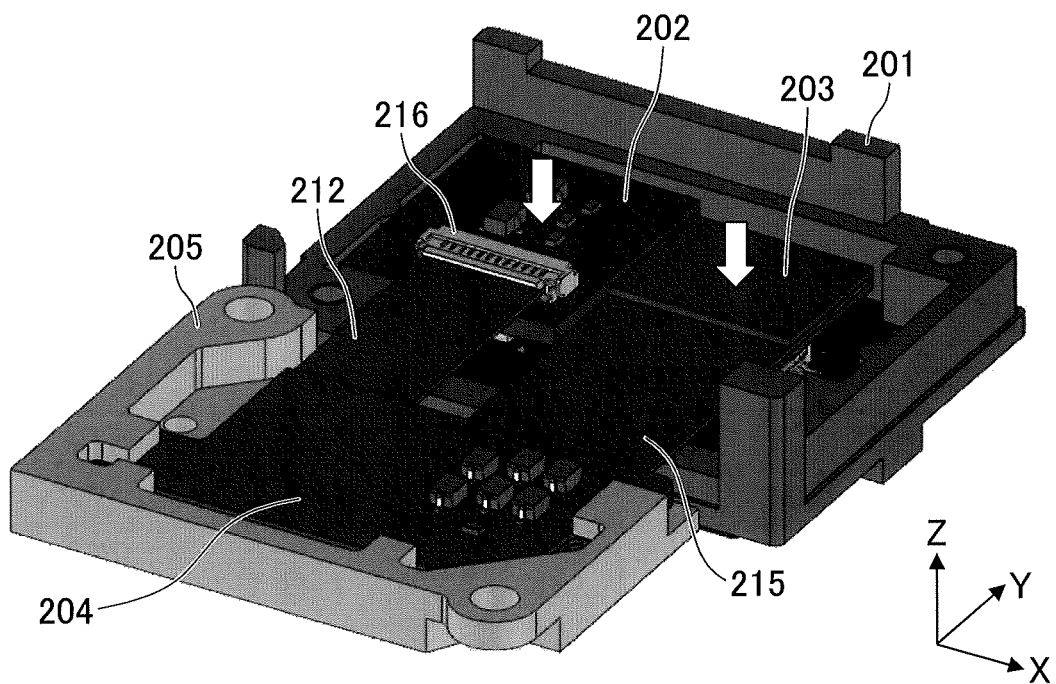
FIG. 9 is a drawing illustrating a state where the impedance conversion circuit board and the connector board are connected to the optical scanner.

In the first embodiment, as illustrated in FIG. 8, the impedance conversion circuit board 202, the connector board 203, and the connecting board 204 are arranged such that the connector 211 is connected to the connector 220 and the connector 213 is connected to the connector 221. FIG. 9 illustrates a state where the connector 211 is connected to the connector 220 and the connector 213 is connected to the connector 221.

In the first embodiment, when the connector 211 is connected to the connector 220, an output terminal of the piezoelectric sensor 111 of the optical scanner 110 is connected to an input terminal of the impedance conversion circuit 120. In other words, with the connector 211 and the connector 220 connected to each other, a sensor signal output from the piezoelectric sensor 111 is input to the impedance conversion circuit 120.

An impedance-converted sensor signal output from the impedance conversion circuit 120 is transmitted via the connector 216 and the cable 212 to the connecting board 204. The connecting board 204 includes a connector 217 described later. The impedance-converted sensor signal transmitted to the connecting board 204 is output via the connector 217 to the outside of the optical scanning device 100.

Also in the first embodiment, with the connector 213 and the connector 221 connected to each other, driving signals supplied from an external device are input to the actuators 150 and 170 of the optical scanner 110.

Figure 10A:
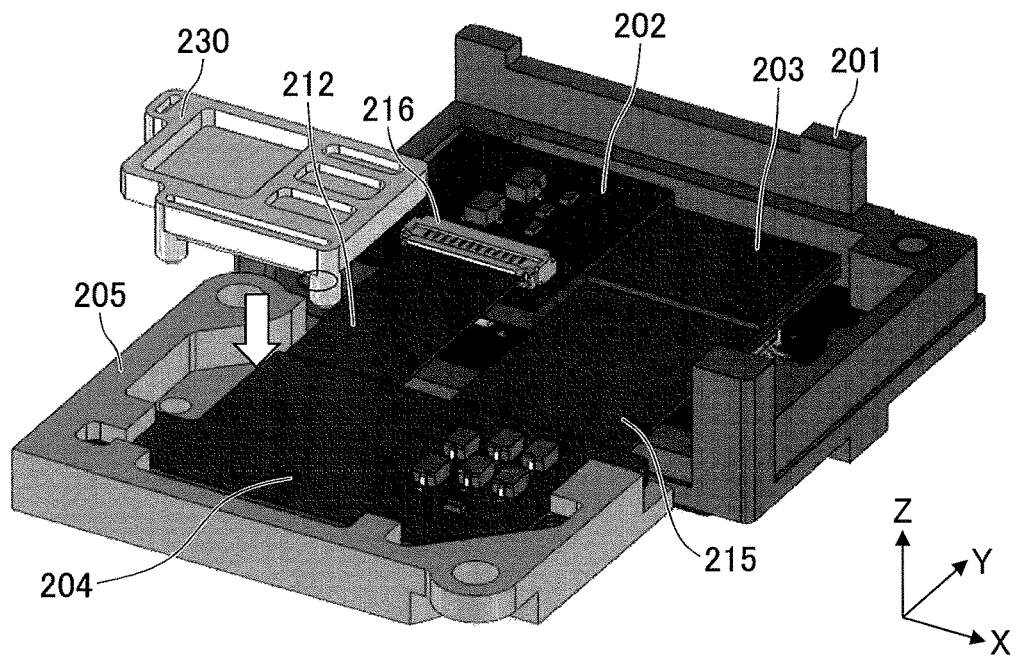
FIGS. 10A and 10B are drawings illustrating how to attach a spacer.
Figure 10B:
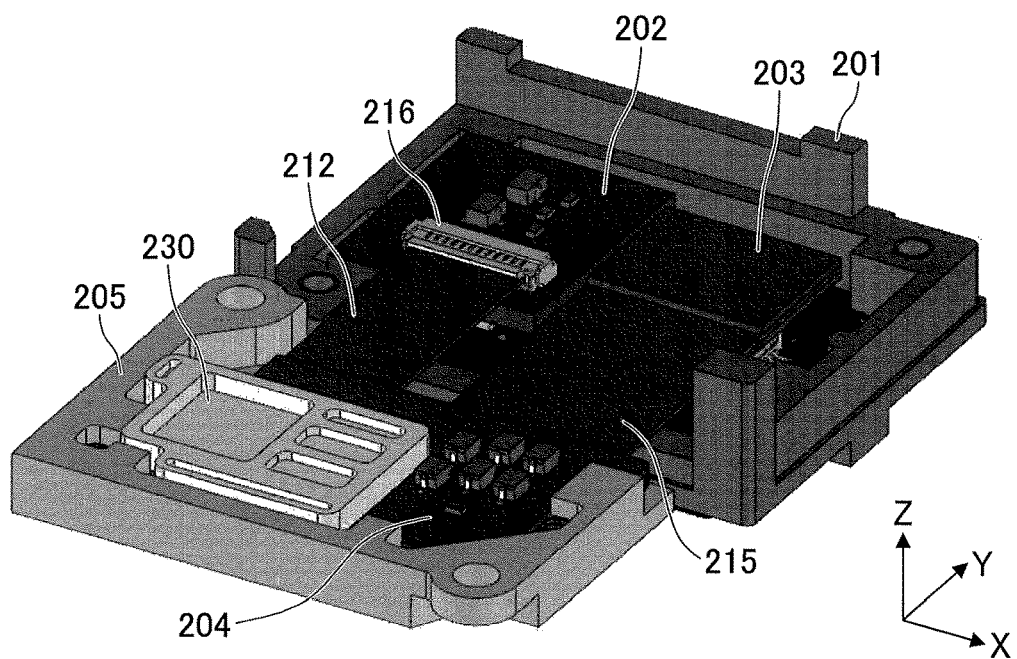

FIGS. 10A and 10B are drawings illustrating how to attach a spacer 230. FIG. 10A illustrates a state before the spacer 230 is attached, and FIG. 10B illustrates a state after the spacer 230 is attached.

In the first embodiment, if a space is formed between the impedance conversion circuit board 202 and the connecting board 204 in a state where the top housing 201 and the bottom housing 205 are stacked, the spacer 230 may be inserted to fill the space.

As illustrated in FIG. 10B, the spacer 230 may be disposed on the connecting board 204 and fixed to the bottom housing 205. Although the spacer 230 is provided in the first embodiment, the spacer 230 may be omitted.

Figure 11A:
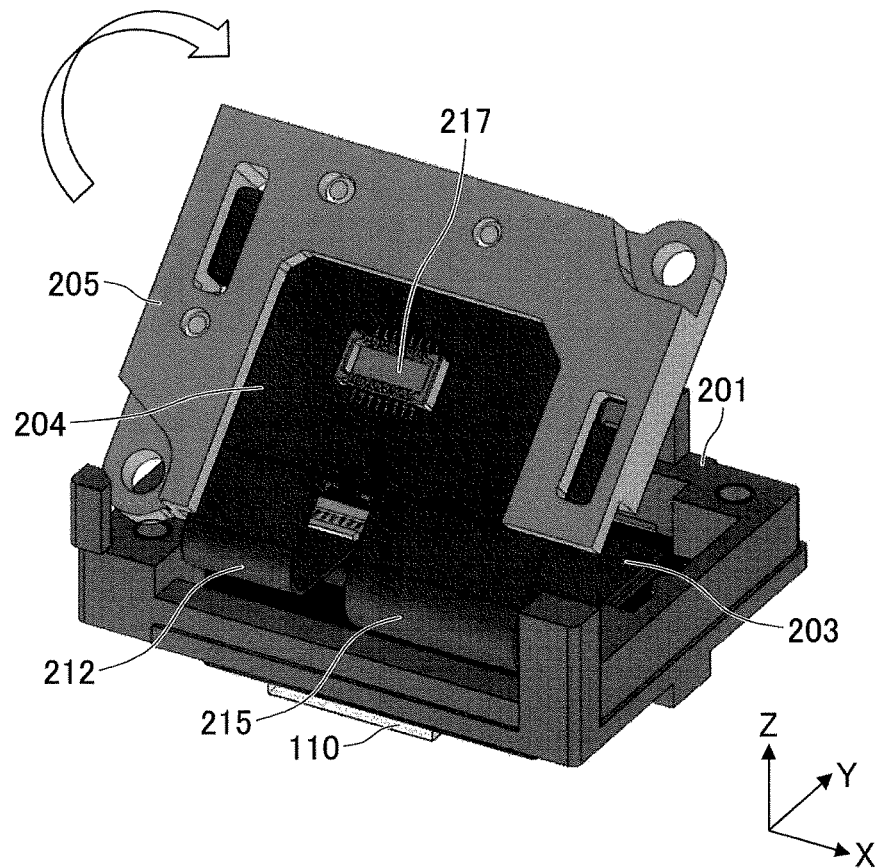
FIGS. 11A and 11B are drawings illustrating how to stack the top housing and the bottom housing.
Figure 11B:
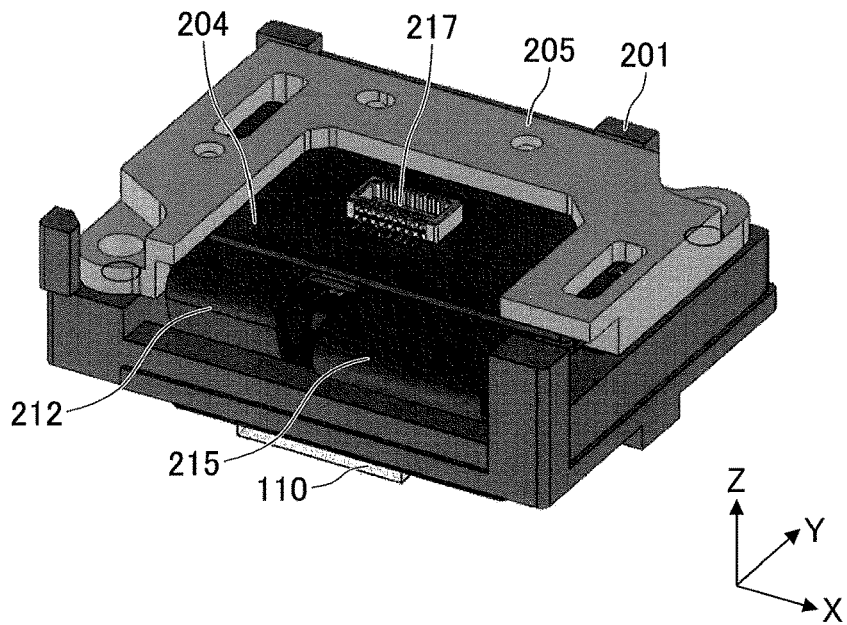

FIGS. 11A and 11B are drawings illustrating how to stack the top housing 201 and the bottom housing 205. FIG. 11A illustrates a state before the top housing 201 and the bottom housing 205 are stacked, and FIG. 11B illustrates a state after the top housing 201 and the bottom housing 205 are stacked.

In the first embodiment, the top housing 201 and the bottom housing 205 are stacked while bending the cables 212 and 215 such that the upper surface (which faces the −Z direction in FIG. 11B) of the bottom housing 205 contacts the lower surface (which faces the +Z direction in FIG. 11B) of the top housing 201.

The connector 217 is mounted on a surface of the connecting board 204 that is opposite the surface on which the spacer 230 is provided. The sensor signal wiring and the driving signal wiring are connected to the connector 217.

In the first embodiment, an impedance-converted sensor signal is output via the cable 212 and the connector 217 to a circuit disposed downstream of the optical scanning device 100. Also in the first embodiment, a driving signal from an external device is supplied via the cable 215 and the connector 217 to the optical scanner 110.

The connector 217 includes a driving terminal for receiving the driving signal and an output terminal for outputting the impedance-converted sensor signal received from the impedance conversion circuit 120 to a circuit disposed downstream of the optical scanning device 100.

Providing the connector 217 makes it possible to mount and use the optical scanning device 100 in a manner similar to an optical scanning device that does not include the impedance conversion circuit 120.

Figure 12A:
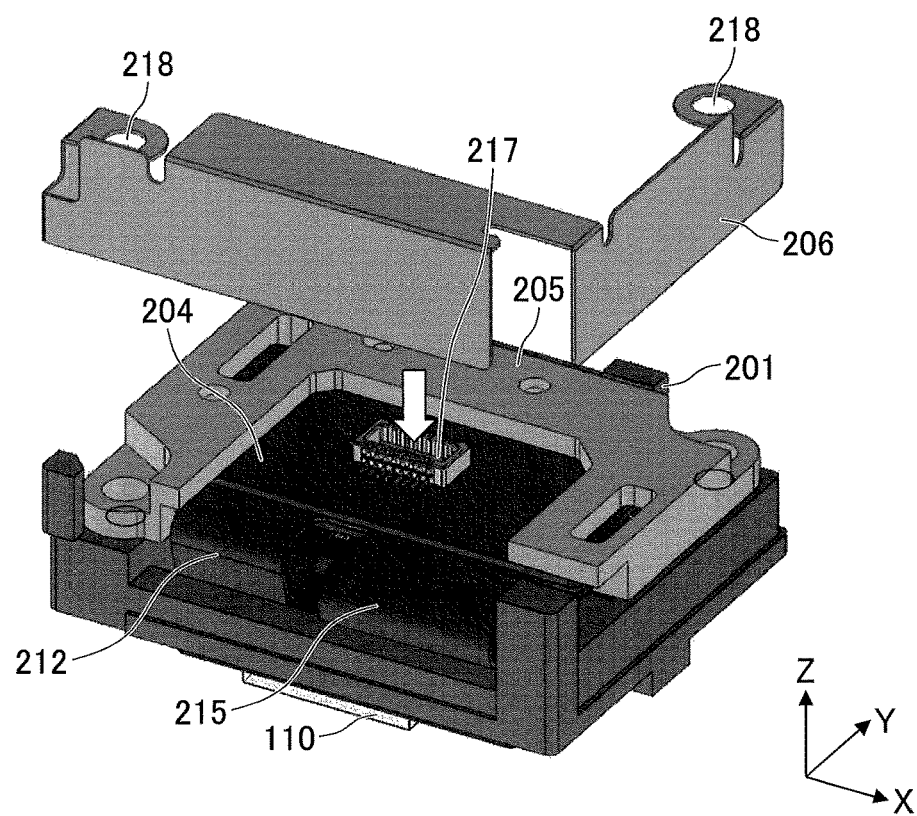
FIGS. 12A and 12B are drawings illustrating how to attach an exterior plate.
Figure 12B:
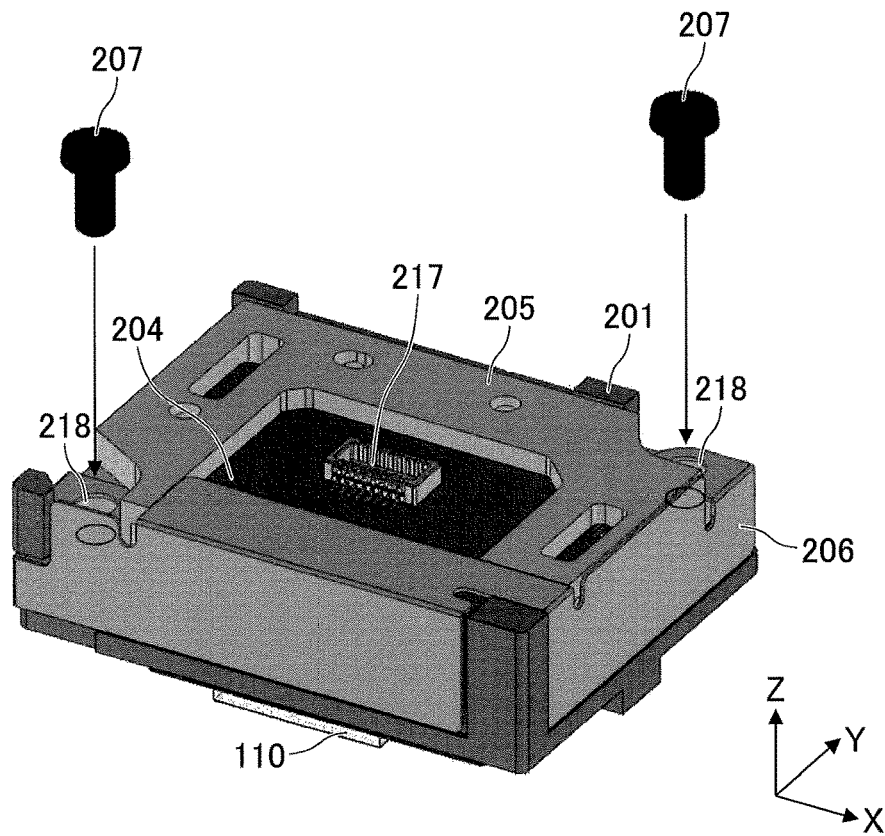

FIGS. 12A and 12B are drawings illustrating how to attach an exterior plate 206. FIG. 12A illustrates a state before the exterior plate 206 is attached, and FIG. 12B illustrates a state after the exterior plate 206 is attached.

In the first embodiment, the exterior plate 206 is attached to an outer surface of a structure formed by stacking the top housing 201 and the bottom housing 205. The exterior plate 206 may be formed of a metal that can suppress electromagnetic interference.

The exterior plate 206 has a substantially L shape and is attached to the top housing 201 and the bottom housing 205 to surround the top housing 201 and the bottom housing 205. The exterior plate 206 is fixed to the top housing 201 and the bottom housing 205 by inserting screws 207 into screw holes 218 formed in the top housing 201, the bottom housing 205, and the exterior plate 206.

Figure 13:
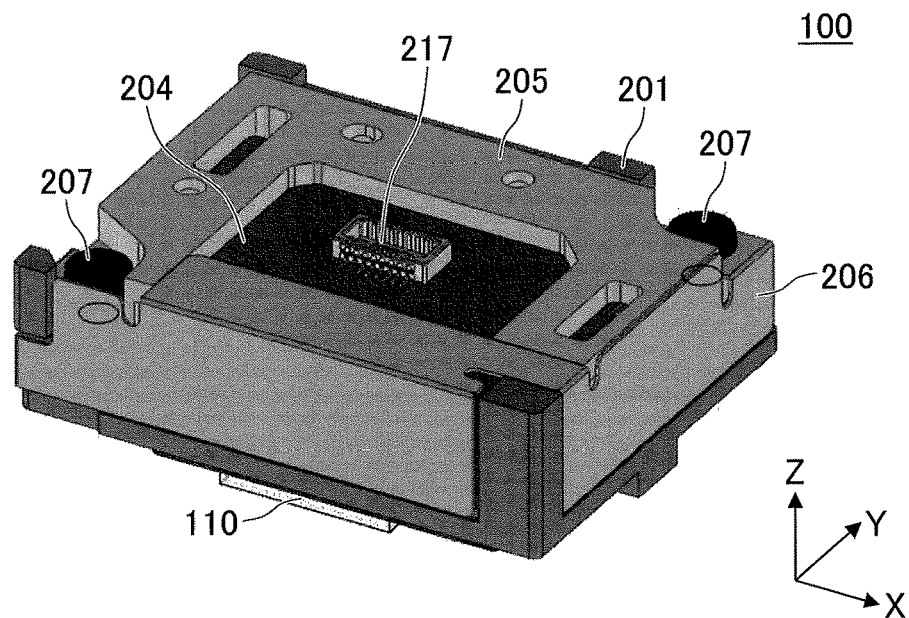
FIG. 13 is a drawing illustrating an example of an assembled optical scanning device.

FIG. 13 is a drawing illustrating an example of the optical scanning device 100 that has been assembled. When a downstream circuit and a drive circuit are connected to the connector 217 of the optical scanning device 100 of FIG. 13, a sensor signal output from the piezoelectric sensor 111 of the optical scanner 110 is output to the downstream circuit and a driving signal is supplied to the optical scanner 110.

As described above, the optical scanning device 100 of the first embodiment includes the impedance conversion circuit board 202 to which a sensor signal from the optical scanner 110 is input and the connector board 203 to which a driving signal is input. This configuration makes it possible to prevent the sensor signal and the driving signal from being transmitted on the same board.

Accordingly, the first embodiment makes it possible to separate a sensor signal output from the optical scanner 110 and a driving signal supplied to the optical scanner 110 from each other, and to prevent the sensor signal from being influenced by electromagnetic induction between wires on the same board.

Also, in the first embodiment, the impedance conversion circuit board 202 is comprised of a high humidity resistance material. This makes it possible to suppress a decrease in insulation resistance in a high-humidity environment.

Also in the first embodiment, the exterior plate 206 is provided to suppress electromagnetic interference from other circuits.

Further, the optical scanning device 100 of the first embodiment includes the impedance conversion circuit 120 as an internal component. This eliminates the need to consider the influence of a load and electromagnetic interference on a sensor signal in a downstream circuit, and thereby makes it possible to improve the flexibility in designing the downstream circuit. For example, the first embodiment makes it possible to use a generic component for the downstream circuit even when a sensor signal tends to be weak.

Also in the first embodiment, the impedance conversion circuit board 202 is disposed adjacent (or close) to the optical scanner 110. This configuration makes it possible to prevent a sensor signal from being influenced by, for example, disturbance in a section between the piezoelectric sensor 111 and the impedance conversion circuit 120.

The optical scanning device 100 of the first embodiment, as a completed product, may also include a cable 240 connected to the connector 217.

Figure 14:
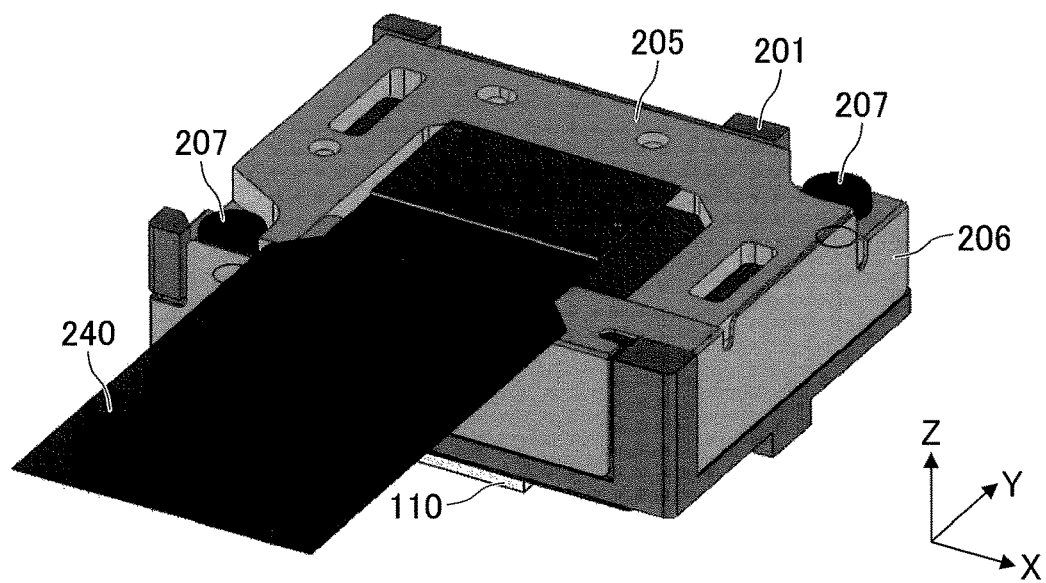
FIG. 14 is a drawing illustrating another example of an assembled optical scanning device.

FIG. 14 is a drawing illustrating another example of the optical scanning device 100 that has been assembled. In the example of FIG. 14, the cable 240 is connected to the connector 217.

Providing the cable 240 as a component of the optical scanning device 100 eliminates the need to provide a component for connection with the connector 217 in the downstream circuit and the drive circuit, and makes it possible to improve the versatility of the optical scanning device 100.

Figure 15:
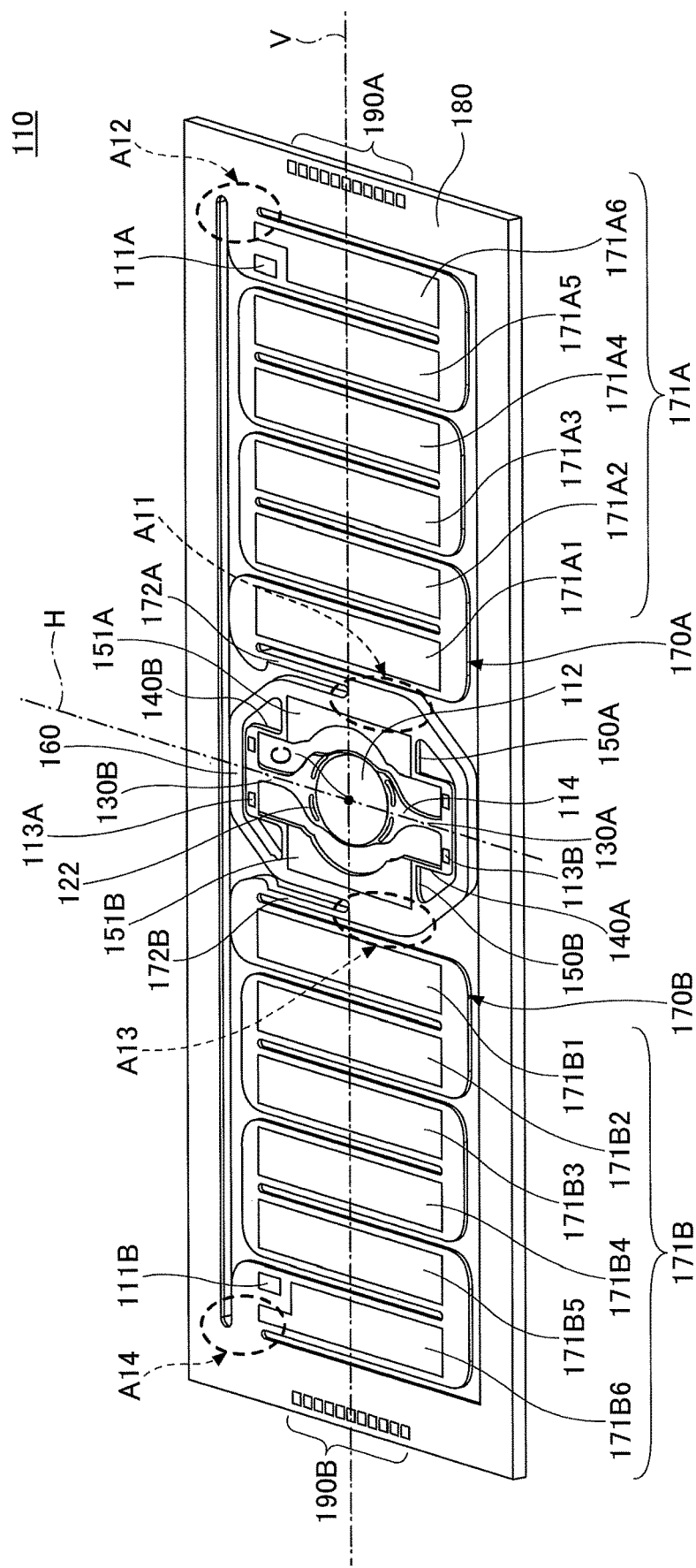
FIG. 15 is a perspective view of an example of an optical scanner according to the first embodiment.
Figure 16:
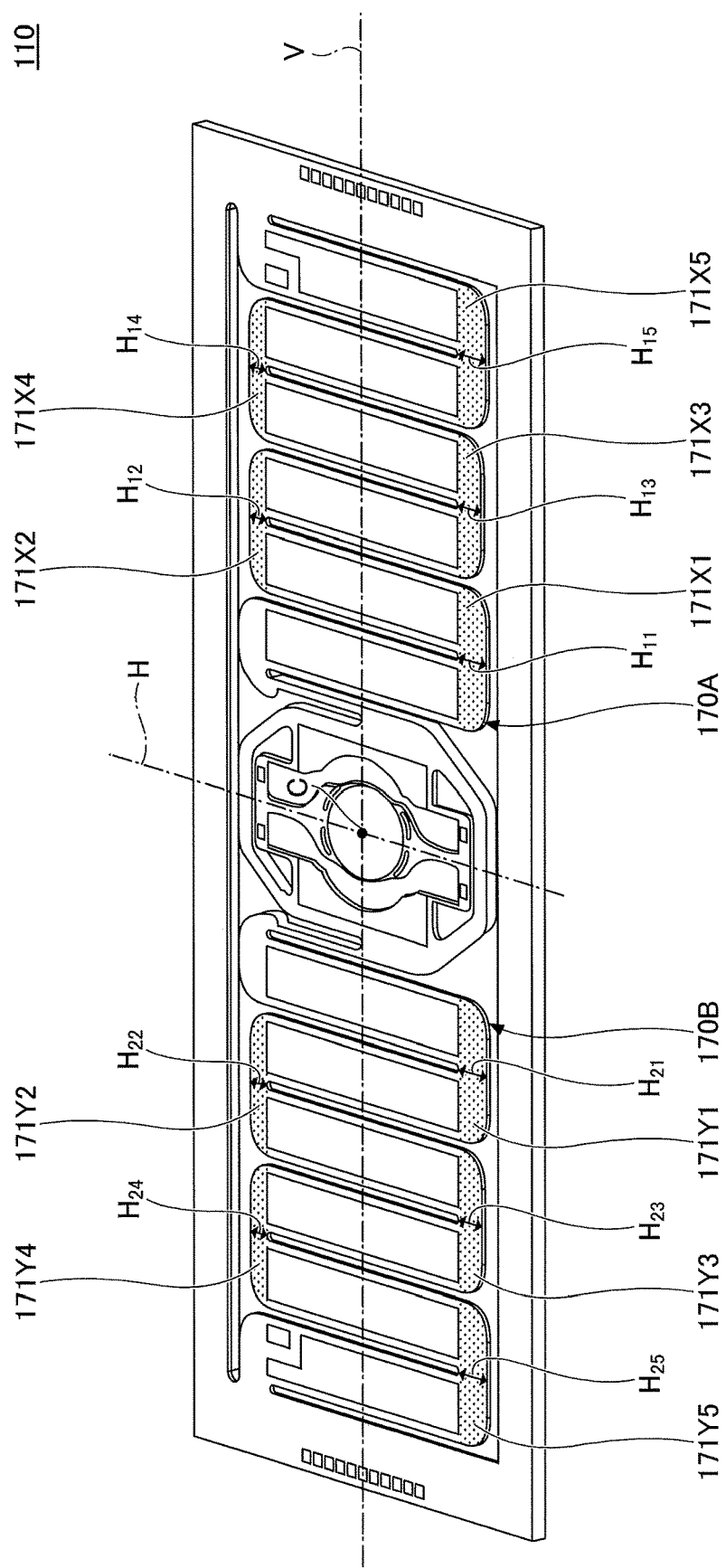
FIG. 16 is a drawing used to describe the heights of turnaround parts of the optical scanner according to the first embodiment.

Next, the optical scanner 110 of the first embodiment is described with reference to FIGS. 15 and 16. FIG. 15 is a perspective view of an example of the optical scanner 110 of the first embodiment. FIG. 16 is a drawing used to describe the heights of turnaround parts of the optical scanner 110 of the first embodiment.

As illustrated in FIG. 15, the optical scanner 110 includes a mirror 112 that is rotated to scan a laser beam emitted by a light source. The optical scanner 110 is, for example, a Micro Electro Mechanical Systems (MEMS) mirror where the mirror 112 is driven by a piezoelectric element.

The optical scanner 110 includes the mirror 112, a mirror support 114, torsion beams 130A and 130B, coupling beams 140A and 140B, first driving beams 150A and 150B, a movable frame 160, second driving beams 170A and 170B, and a fixed frame 180.

The first driving beams 150A and 150B include driving sources 151A and 151B, respectively. The second driving beams 170A and 170B include driving sources 171A and 171B, respectively. The first driving beams 150A and 150B and the second driving beams 170A and 170B are actuators for causing the mirror 112 to rotate (or oscillate) vertically or horizontally to scan a laser beam, and correspond to the actuators 150 and 170 in FIG. 1. In other words, the actuators 150 are driving sources for rotating the mirror 112 around predetermined axes.

In the optical scanner 110, the movable frame 160 is connected to the second driving beam 170A at a movable frame connection part A11. The fixed frame 180 is connected to the second driving beam 170A at a fixed frame connection part A12. The movable frame connection part A11 is located substantially opposite the fixed frame connection part A12 with respect to an axis (which is hereafter referred to as a "vertical rotation axis V") that passes a center C of a light reflection surface of the mirror 112.

The movable frame 160 is connected to the second driving beam 170B at a movable frame connection part A13. The fixed frame 180 is connected to the second driving beam 170B at a fixed frame connection part A14. The movable frame connection part A13 is located substantially opposite the fixed frame connection part A14 with respect to the vertical rotation axis V.

The movable frame connection parts A11 and A13 may be located opposite the fixed frame connection parts A12 and A14 with respect to the vertical rotation axis V such that end portions of the movable frame connection parts A11 and A13 overlap the vertical rotation axis V.

The second driving beam 170A and the second driving beam 170B are axisymmetric about a line (which is hereafter referred to as a "horizontal rotation axis H") that passes through the center C of the light reflection surface of the mirror 112 and is perpendicular to the vertical rotation axis V.

Slits 122 are formed in the mirror support 114 along the circumference of the mirror 112. The slits 122 reduce the weight of the mirror support 114 and enable the mirror support 114 to transmit torsion of the torsion beams 130A and 130B to the mirror 112.

In the optical scanner 110, the mirror 112 is supported on an upper surface of the mirror support 114, and the mirror support 114 is connected to the ends of the torsion beams 130A and 130B at the corresponding sides of the mirror support 114. The torsion beams 130A and 130B form a rotation shaft extending in an axial direction and support the ends of the mirror support 114 in the axial direction. When the torsion beams 130A and 130B are twisted, the mirror 112 supported by the mirror support 114 rotates (or oscillates) and scans reflected light of light emitted toward the mirror 112. The torsion beams 130A and 130B are connected, respectively, to the coupling beams 140A and 140B and are thereby coupled to the first driving beams 150A and 150B.

The first driving beams 150A and 150B, the coupling beams 140A and 140B, the torsion beams 130A and 130B, the mirror support 114, and the mirror 112 are supported by the movable frame 160 surrounding these components. One side of each of the first driving beams 150A and 150B is supported by the movable frame 160. Another side of the first driving beam 150A extends inward and is connected to the coupling beams 140A and 140B. Similarly, another side of the first driving beam 150B extends inward and is connected to the coupling beams 140A and 140B.

The first driving beams 150A and 150B are disposed to sandwich the mirror 112 and the mirror support 114 in a direction orthogonal to the torsion beams 130A and 130B. The driving sources 151A and 151B are formed, respectively, on the upper surfaces of the first driving beams 150A and 150B. Each of the driving sources 151A and 151B includes an upper electrode formed on the upper surface of a thin film implementing a piezoelectric element (which is hereafter referred to as a "piezoelectric thin film") on the upper surface of the first driving beam 150A or 150B and a lower electrode formed on the lower surface of the piezoelectric thin film. The driving sources 151A and 151B expand and contract depending on the polarity of a driving voltage applied to the upper electrode and the lower electrode.

Accordingly, when driving voltages with different phases are alternately applied to the first driving beam 150A and the first driving beam 150B, the first driving beam 150A and the first driving beam 150B located on the left and right sides of the mirror 112 alternately oscillate in opposite vertical directions and cause the mirror 112 to rotate (or oscillate) around a rotational axis or an oscillation axis defined by the torsion beams 130A and 130B. Hereafter, the direction in which the mirror 112 rotates around the torsion beams 130A and 130B is referred to as a "horizontal direction". For example, resonant oscillation is used for the horizontal driving by the first driving beams 150A and 150B to cause the mirror 112 to rotate (or oscillate) at high speed.

First ends of the second driving beams 170A and 170B are connected via coupling beams 172A and 172B to the outer side of the movable frame 160 at the movable frame connection parts A11 and A13. The second driving beams 170A and 170B are disposed to sandwich the movable frame 160 from right and left sides. The second driving beams 170A and 170B support the movable frame 160 and cause the movable frame 160 to rotate (or oscillate) around the vertical rotation axis V. A second end of the second driving beam 170A is connected to the inner side of the fixed frame 180 at the fixed frame connection part A12. A second end of the second driving beam 170B is connected to the inner side of the fixed frame 180 at the fixed frame connection part A14.

Thus, in the optical scanner 110, the movable frame connection part A11 at which the movable frame 160 is connected to the second driving beam 170A is located substantially opposite the fixed frame connection part A12 at which the fixed frame 180 is connected to the second driving beam 170A with respect to the vertical rotation axis V.

Also, in the optical scanner 110, the movable frame connection part A13 at which the movable frame 160 is connected to the second driving beam 170B is located substantially opposite the fixed frame connection part A14 at which the fixed frame 180 is connected to the second driving beam 170B with respect to the vertical rotation axis V.

The movable frame connection parts A11 and A13 may be located opposite the fixed frame connection parts A12 and A14 with respect to the vertical rotation axis V such that end portions of the movable frame connection parts A11 and A13 overlap the vertical rotation axis V. Also, the second driving beam 170A and the second driving beam 170B are axisymmetric about the horizontal rotation axis H.

As illustrated in FIGS. 15 and 16, the second driving beam 170A includes multiple vertical beams having a rectangular shape and arranged in a direction perpendicular to the horizontal rotation axis H (a direction parallel to the first driving beam 150A) and turnaround parts each of which joins the ends of adjacent vertical beams. Thus, the second driving beam 170A has a zigzag shape.

For example, when counted from the side closer to the first driving beam 150A, an end of the first vertical beam and an end of the second vertical beam are joined by a turnaround part 171X1. Also, another end of the second vertical beam and an end of the third vertical beam are joined by a turnaround part 171X2. Another end of the third vertical beam and an end of the fourth vertical beam are joined by a turnaround part 171X3. Another end of the fourth vertical beam and an end of the fifth vertical beam are joined by a turnaround part 171X4. Another end of the fifth vertical beam and an end of the sixth vertical beam are joined by a turnaround part 171X5. In FIG. 16, the turnaround parts are indicated by shading.

Similarly, the second driving beam 170B includes multiple vertical beams having a rectangular shape and arranged in a direction perpendicular to the horizontal rotation axis H (a direction parallel to the first driving beam 150B) and turnaround parts each of which joins the ends of adjacent vertical beams. Thus, the second driving beam 170B has a zigzag shape.

For example, when counted from the side closer to the first driving beam 150B, an end of the first vertical beam and an end of the second vertical beam are joined by a turnaround part 171Y1. Also, another end of the second vertical beam and an end of the third vertical beam are joined by a turnaround part 171Y2. Another end of the third vertical beam and an end of the fourth vertical beam are joined by a turnaround part 171Y3. Another end of the fourth vertical beam and an end of the fifth vertical beam are joined by a turnaround part 171Y4. Another end of the fifth vertical beam and an end of the sixth vertical beam are joined by a turnaround part 171Y5.

The turnaround parts 171X1, 171X2, 171X3, 171X4, and 171X5 have heights $H_{11}$, $H_{12}$, $H_{13}$, $H_{14}$, and $H_{15}$, respectively. The turnaround parts 171Y1, 171Y2, 171Y3, 171Y4, and 171Y5 have heights $H_{21}$, $H_{22}$, $H_{23}$, $H_{24}$, and $H_{25}$, respectively. The height of each turnaround part is the maximum length of the turnaround part in a direction parallel to the horizontal rotation axis H (or a direction that is perpendicular to the vertical rotation axis V).

On the upper surfaces of the second driving beams 170A and 170B, the driving sources 171A and 171B are formed for respective vertical beams that are rectangular units including no curved section. The driving source 171A includes an upper electrode formed on a piezoelectric thin film on the upper surface of the second driving beam 170A and a lower electrode formed on the lower surface of the piezoelectric thin film. The driving source 171B includes an upper electrode formed on a piezoelectric thin film on the upper surface of the second driving beam 170B and a lower electrode formed on the lower surface of the piezoelectric thin film.

In each of the second driving beams 170A and 170B, driving voltages with different polarities are applied to driving sources (171A or 171B) on adjacent vertical beams to cause the adjacent vertical beams to warp in opposite vertical directions, and the accumulation of the vertical movement of the vertical beams is transmitted to the movable frame 160. With this mechanism, the second driving beams 170A and 170B cause the mirror 112 to rotate (or oscillate) in a vertical direction that is orthogonal to the horizontal direction. For example, nonresonant oscillation may be used for the vertical driving by the second driving beams 170A and 170B.

For example, the driving source 171A includes driving sources 171A1, 171A2, 171A3, 171A4, 171A5, and 171A6 that are arranged rightward from the movable frame 160. Also, the driving source 171B includes driving sources 171B1, 171B2, 171B3, 171B4, 171B5, and 171B6 that are arranged leftward from the movable frame 160. In this case, the mirror 112 can be rotated in the vertical direction by driving the driving sources 171A1, 171B1, 171A3, 171B3, 171A5, and 171B5 using the same waveform with a first phase and driving the driving sources 171A2, 171B2, 171A4, 171B4, 171A6, and 171B6 using the same waveform with a second phase that is different from the first phase.

Drive wires for applying driving voltages to the upper electrode and the lower electrode of the driving source 151A are connected to predetermined terminals in a terminal group 190A provided on the fixed frame 180. Also, drive wires for applying driving voltages to the upper electrode and the lower electrode of the driving source 151B are connected to predetermined terminals in a terminal group 190B provided on the fixed frame 180. Drive wires for applying driving voltages to the upper electrode and the lower electrode of the driving source 171A are connected to predetermined terminals in the terminal group 190A provided on the fixed frame 180. Also, drive wires for applying driving voltages to the upper electrode and the lower electrode of the driving source 171B are connected to predetermined terminals in the terminal group 190B provided on the fixed frame 180.

The optical scanner 110 also includes piezoelectric sensors 113A and 113B used as horizontal tilt angle sensors that detect a tilt in the horizontal direction (horizontal tilt angle) of the mirror 112 while the mirror 112 is being rotated in the horizontal direction by applying driving voltages to the driving sources 151A and 151B. The piezoelectric sensor 113A is provided on the coupling beam 140A, and the piezoelectric sensor 113B is provided on the coupling beam 140B.

The optical scanner 110 also includes piezoelectric sensors 111A and 111B used as vertical tilt angle sensors that detect a tilt in the vertical direction (vertical tilt angle) of the mirror 112 while the mirror 112 is being rotated in the vertical direction by applying driving voltages to the driving sources 171A and 171B. The piezoelectric sensors 111A and 111B correspond to the piezoelectric sensor 111 in FIG. 1. In the first embodiment, a sensor signal (first sensor signal) output from the piezoelectric sensors 111A and 111B (first piezoelectric sensor) is input to the impedance conversion circuit 120, and a sensor signal (second sensor signal) output from the piezoelectric sensors 113A and 113B (second piezoelectric sensor) is output from the connector 217 without passing through the impedance conversion circuit 120.

The piezoelectric sensor 111A is provided on one of the vertical beams of the second driving beam 170A, and the piezoelectric sensor 111B is provided on one of the vertical beams of the second driving beam 170B.

The piezoelectric sensor 113A outputs a current value that varies depending on the tilt angle of the mirror 112 in the horizontal direction and corresponds to the displacement of the coupling beam 140A transferred from the torsion beam 130A. The piezoelectric sensor 113B outputs a current value that varies depending on the tilt angle of the mirror 112 in the horizontal direction and corresponds to the displacement of the coupling beam 140B transferred from the torsion beam 130B. The piezoelectric sensor 111A outputs a current value that varies depending on the tilt angle of the mirror 112 in the vertical direction and corresponds to the displacement of the vertical beam of the second driving beam 170A on which the piezoelectric sensor 111A is provided. The piezoelectric sensor 111B outputs a current value that varies depending on the tilt angle of the mirror 112 in the vertical direction and corresponds to the displacement of the vertical beam of the second driving beam 170B on which the piezoelectric sensor 111B is provided.

Each of the piezoelectric sensors 113A, 113B, 111A, and 111B includes an upper electrode formed on the upper surface of a piezoelectric thin film and a lower electrode formed on the lower surface of the piezoelectric thin film. Accordingly, each of the piezoelectric sensors outputs a current value of sensor wires connected to the upper electrode and the lower electrode.

The sensor wires extending from the upper electrode and the lower electrode of the piezoelectric sensor 113A are connected to predetermined terminals in the terminal group 190B provided on the fixed frame 180. The sensor wires extending from the upper electrode and the lower electrode of the piezoelectric sensor 111A are connected to predetermined terminals in the terminal group 190A provided on the fixed frame 180. The sensor wires extending from the upper electrode and the lower electrode of the piezoelectric sensor 113B are connected to predetermined terminals in the terminal group 190B provided on the fixed frame 180. The sensor wires extending from the upper electrode and the lower electrode of the piezoelectric sensor 111B are connected to predetermined terminals in the terminal group 190B provided on the fixed frame 180.

In the first embodiment, terminals in the terminal groups 190A and 190B connected to the sensor wires extending from the piezoelectric sensors 111A and 111B may be connected to input terminals of the impedance conversion circuit 120. Also in the first embodiment, terminals in the terminal groups 190A and 190B connected to the sensor wires extending from the piezoelectric sensors 113A and 113B may be connected to the cable 212.

Next, a head-up display including the optical scanning device 100 of the first embodiment is described with reference to FIG. 17.

Figure 17:
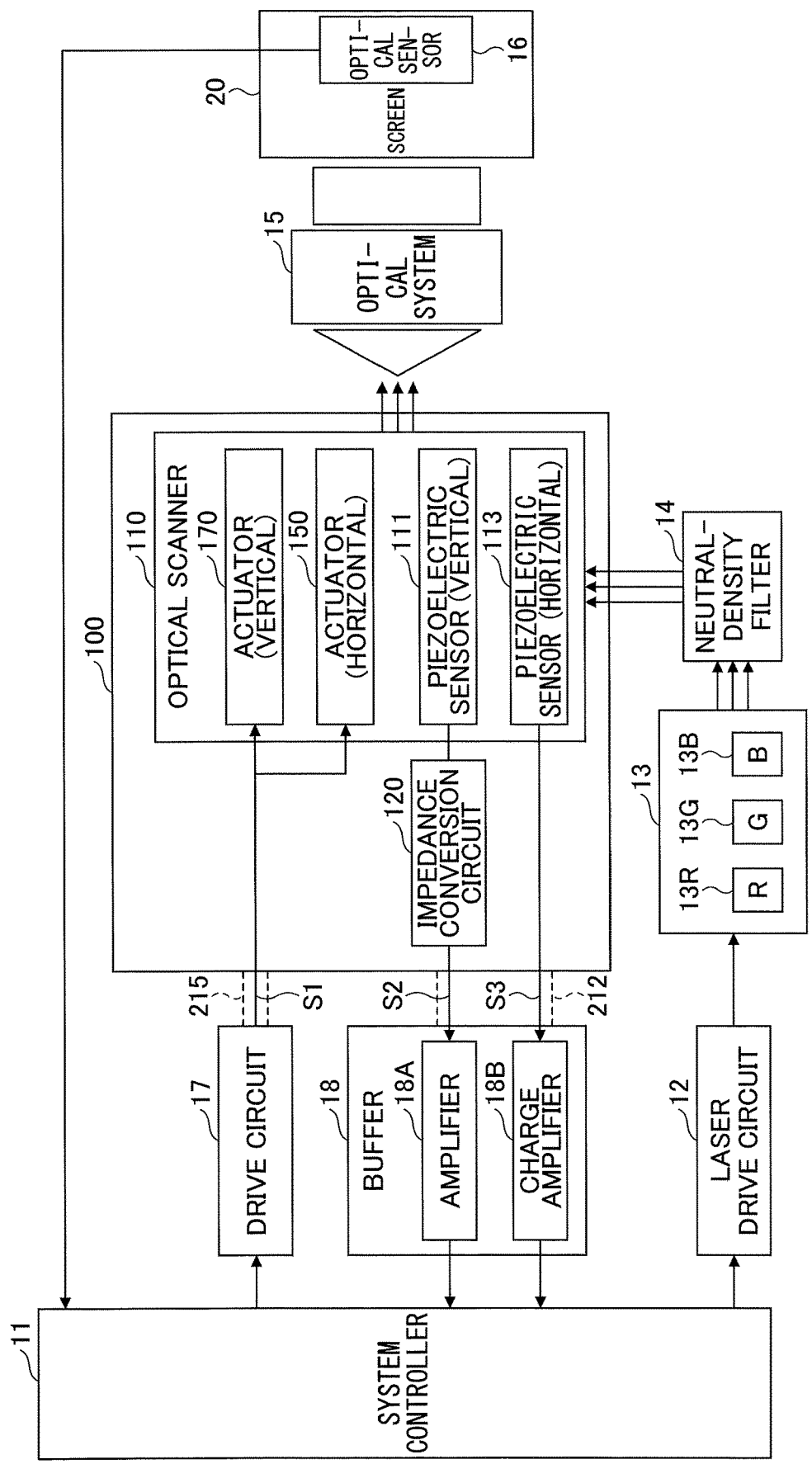
FIG. 17 is a block diagram illustrating an exemplary configuration of a head-up display including the optical scanning device of the first embodiment.

FIG. 17 is a block diagram illustrating an exemplary configuration of a head-up display 1 including the optical scanning device 100 of the first embodiment.

For example, the head-up display 1 is embedded in a dashboard in front of a driver seat of a vehicle. The head-up display 1 displays images projected on a screen 20 and representing various types of information (e.g., a speedometer and a route guide) on a windshield of a vehicle to enable a driver to view the displayed images.

The head-up display 1 of the first embodiment includes, in addition to the optical scanning device 100, a system controller 11, a laser drive circuit 12, a light source 13, a neutral-density filter 14, an optical system 15, an optical sensor 16, a drive circuit 17, and a buffer 18.

The system controller 11 supplies angle control signals to the drive circuit 17. Based on the angle control signals from the system controller 11, the drive circuit 17 supplies driving signals to the actuators 150 and 170 to rotate the mirror 112 in the horizontal and vertical directions.

The drive circuit 17 is connected to the actuators 150 and 170 via the connector 217, the cable 215, and the connector 213. That is, driving signals supplied to the actuators 150 and 170 are supplied to the optical scanner 110 via a driving signal line S1 formed in the cable 215.

The system controller 11 also controls the mirror 112 based on sensor signals output from the optical scanning device 100.

Sensor signals output from the optical scanning device 100 are input to the buffer 18, and the sensor signals amplified by the buffer 18 are supplied to the system controller 11.

More specifically, a sensor signal output from the impedance conversion circuit 120 of the optical scanning device 100 is supplied to and amplified by an amplifier 18A of the buffer 18, and the amplified sensor signal is supplied to the system controller 11. Also, a sensor signal output from the piezoelectric sensor 113 of the optical scanning device 100 is supplied to and amplified by a charge amplifier 18B of the buffer 18, and the amplified sensor signal is supplied to the system controller 11.

The impedance conversion circuit 120 and the piezoelectric sensor 113 are connected to the buffer 18 via the connector 217, the cable 212, and the connector 211. That is, the sensor signal from the impedance conversion circuit 120 is output to the, buffer 18 via a sensor signal line S2 formed in the cable 212. Also, the sensor signal from the piezoelectric sensor 113 is output to the buffer 18 via a sensor signal line S3 formed in the cable 212.

In the optical scanning device 100, the sensor signal output from the impedance conversion circuit 120 to the buffer 18 is a sensor signal (first sensor signal) that is output from the piezoelectric sensor 111 (first piezoelectric sensor)

and corresponds to a rotational angle of the mirror 112 in the vertical direction. Also in the optical scanning device 100, the sensor signal output to the buffer 18 without passing through the impedance conversion circuit 120 is a sensor signal (second sensor signal) that is output from the piezoelectric sensor 113 (second piezoelectric sensor) and corresponds to a rotational angle of the mirror 112 in the horizontal direction.

Thus, the optical scanning device 100 of the first embodiment outputs, to the buffer 18, a sensor signal that is impedance-converted by the impedance conversion circuit 120 as a sensor signal corresponding to a rotational angle of the mirror 112 in the vertical direction.

Also, in the first embodiment, the driving signal line S1 for supplying a driving signal to the optical scanning device 100 and the sensor signal lines S2 and S3 for outputting sensor signals from the optical scanning device 100 are formed in different cables and separated from each other.

This configuration of the first embodiment makes it possible to prevent even a weak sensor signal output from the piezoelectric sensor 111 from being influenced by, for example, a load of a circuit disposed downstream of the optical scanning device 100, an environmental condition such as humidity, and disturbance caused by electromagnetic induction between wires. For this reason, in the head-up display 1 of the first embodiment, it is possible to use a generic component for a circuit such as the amplifier 18A of the buffer 18 disposed downstream of the optical scanning device 100.

The system controller 11 also supplies a digital video signal to the laser drive circuit 12. Based on the video signal from the system controller 11, the laser drive circuit 12 supplies driving currents to lasers 13R, 13G, and 13B of the light source 13 and causes the lasers 13R, 13G, and 13B to emit laser beams.

The lasers 13R, 13G, and 13B emit light beams based on the driving currents supplied from the laser drive circuit 12. The laser 13R is, for example, a red semiconductor laser that emits a light beam with a wavelength λR (e.g., 640 nm). The laser 13G is, for example, a green semiconductor laser that emits a light beam with a wavelength λG (e.g., 530 nm). The laser 13B is, for example, a blue semiconductor laser that emits a light beam with a wavelength λB (e.g., 445 nm). The light beams with different wavelengths emitted from the lasers 13R, 13G, and 13B are combined by, for example, a dichroic mirror, the intensity of the combined light beam is reduced by the neutral-density filter 14 to a predetermined intensity, and the intensity-reduced light beam enters the mirror 112 of the optical scanner 110.

The reflection direction of the laser beam entering the mirror 112 is changed by the horizontal and vertical driving of the mirror 112, and the light beam is directed to the screen 20 after being repeatedly reflected by the optical system 15.

The optical sensor 16 is provided on the screen 20, detects the laser beam in each of the outbound and inbound passes in the horizontal scanning, and reports the detection of the laser beam to the system controller 11. The system controller 11 may be configured to correct, for example, a phase shift in the horizontal scanning direction or a tilt angle fluctuation based on the report from the optical sensor 16.

In the first embodiment, a sensor signal corresponding to the rotational angle of the mirror 112 in the vertical direction is input to the impedance conversion circuit 120. However, the present invention is not limited to this configuration.

In the optical scanner 110 of the optical scanning device 100 of the first embodiment, the configuration of the first driving beams 150A and 150B (horizontal actuators) may be replaced with the configuration of the second driving beams 170A and 170B (vertical actuators), and the turnaround structure may be employed for both of the first driving beams 150A and 150B and the second driving beams 170A and 170B. In this case, both of the first driving beams 150A and 150B and the second driving beams 170A and 170B may be driven by nonresonant oscillation.

Also in this case, both of the sensor signal output from the piezoelectric sensor 111 (vertical sensor) and the sensor signal output from the piezoelectric sensor 113 (horizontal sensor) may be input to the impedance conversion circuit 120 for impedance conversion and then output to the buffer 18.

<Second Embodiment>

Next, a second embodiment is described with reference to FIGS. 18 and 19. An optical scanning device 100A of the second embodiment is different from the optical scanning device 100 of the first embodiment in that the optical scanner 110 and the impedance conversion circuit 120 are integrated into a single package. In the descriptions of the second embodiment below, differences from the first embodiment are mainly described. For this purpose, the same reference numbers as those used in the first embodiment are assigned to the corresponding components in the second embodiment, and descriptions of those components are omitted.

Figure 18:
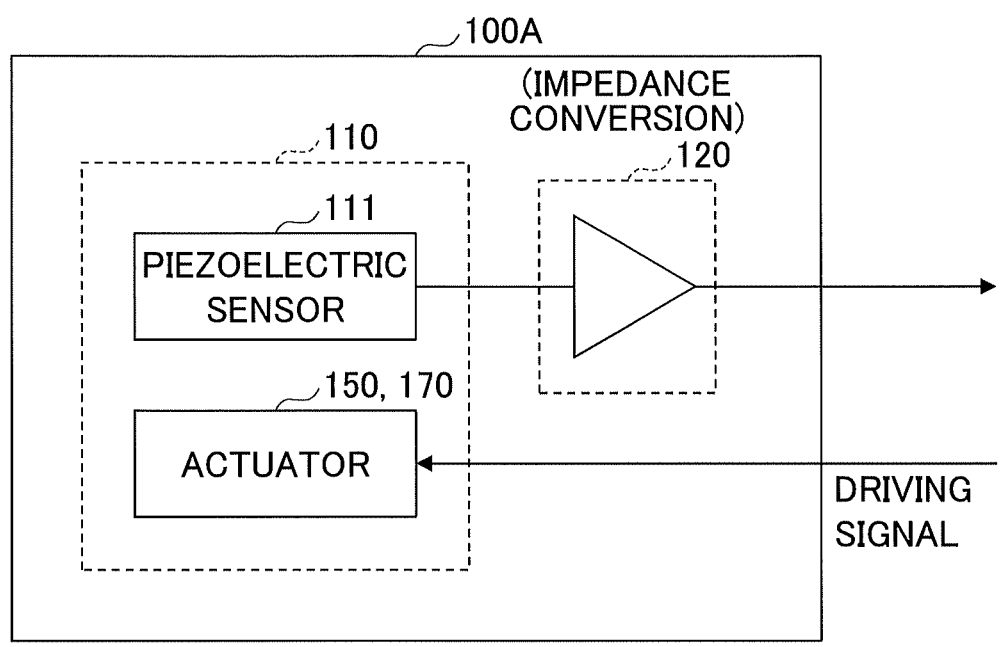
FIG. 18 is a block diagram illustrating an exemplary configuration of an optical scanning device according to a second embodiment.

FIG. 18 is a block diagram illustrating an exemplary configuration of the optical scanning device 100A of the second embodiment. In the optical scanning device 100A of the second embodiment, the piezoelectric sensor 111, the actuators 150 and 170, and the impedance conversion circuit 120 are integrated into a single package. More specifically, the optical scanning device 100A is formed by placing the impedance conversion circuit 120 in the optical scanner 110 of the first embodiment and by encapsulating the optical scanner 110 in a ceramic package.

Figure 19A:
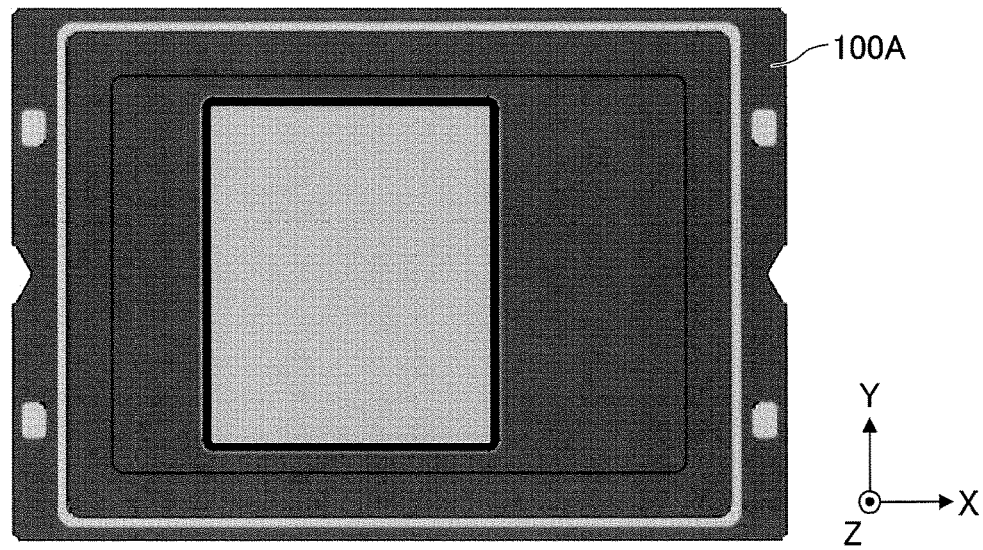
FIGS. 19A through 19C are drawings illustrating the exterior of the optical scanning device according to the second embodiment.
Figure 19B:
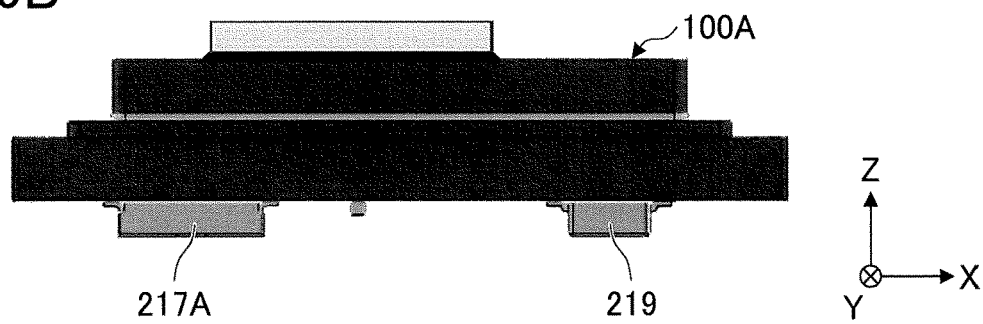
Figure 19C:
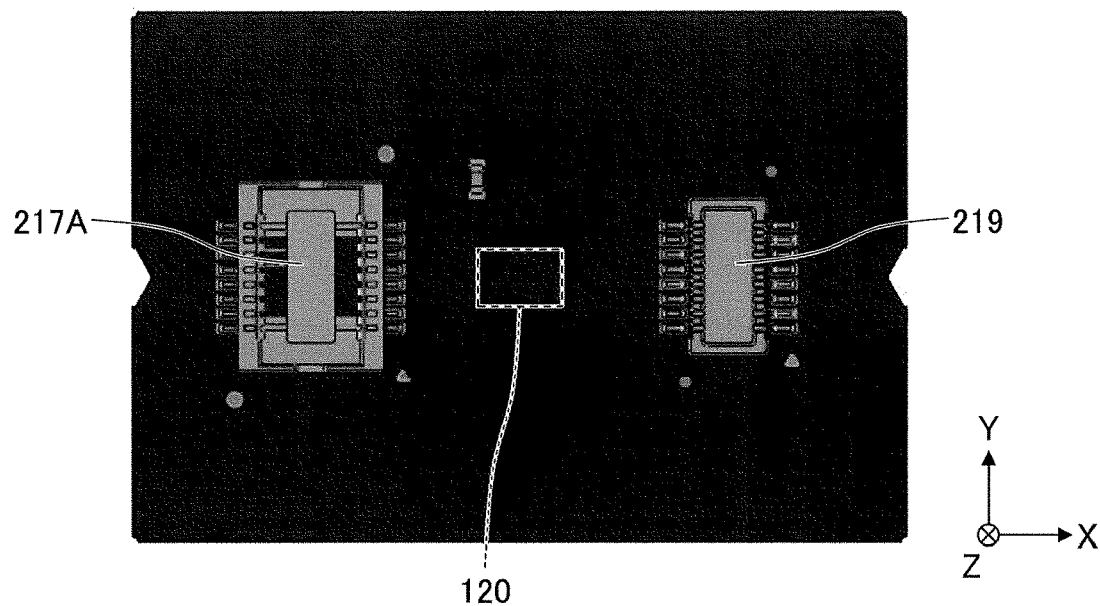

FIGS. 19A through 19C are drawings illustrating the exterior of the optical scanning device 100A of the second embodiment. FIG. 19A is a top view of the optical scanning device 100A, FIG. 19B is an elevational view of the optical scanning device 100A, and FIG. 19C is a bottom view of the optical scanning device 100A.

The optical scanning device 100A of the second embodiment includes a connector 217A and a connector 219. Also, the optical scanning device 100A includes the impedance conversion circuit 120 that is encapsulated in the ceramic package and receives a sensor signal output from the piezoelectric sensor 111.

The connector 217A is used to output, to a downstream circuit, a sensor signal that is output from the piezoelectric sensor 111 and impedance-converted by the impedance conversion circuit 120 and a sensor signal that is output from the piezoelectric sensor 113 without passing through the impedance conversion circuit 120.

The connector 219 is connected to a drive circuit provided outside of the optical scanning device 100A and is used to supply driving signals to the actuators 150 and 170.

Thus, in the second embodiment, a connector for outputting a sensor signal and a connector for supplying a driving signal are provided separately to separate the sensor signal and the driving signal.

In the optical scanning device 100A of the second embodiment, the impedance conversion circuit 120 and the optical scanner 110 are integrated and encapsulated in a ceramic package. This configuration makes it possible to prevent a sensor signal from being influenced by external electromagnetic interference. The configuration of the second embodiment also makes it possible to suppress a decrease in insulation resistance.

An optical scanning device and a head-up display according to embodiments of the present invention are described above. However, the present invention is not limited to the specifically disclosed embodiments, and variations and modifications may be made without departing from the scope of the present invention.

What is claimed is:

1. An optical scanning device, comprising:
   an optical scanner including
   a mirror that includes a light reflection surface,
   an actuator configured to rotate the mirror around a rotation axis passing through a center of the light reflection surface in response to a driving signal, and
   a piezoelectric sensor configured to output a sensor signal corresponding to a rotational angle of the mirror around the rotation axis; and
   an impedance conversion circuit configured to receive the sensor signal from the piezoelectric sensor, perform impedance conversion on the received sensor signal, and output the impedance-converted sensor signal.

2. The optical scanning device as claimed in claim 1, wherein
   the piezoelectric sensor comprises
   a first piezoelectric sensor configured to output a first sensor signal corresponding to a rotational angle of the mirror around a vertical rotation axis passing though the center of the light reflection surface, and
   a second piezoelectric sensor configured to output a second sensor signal corresponding to a rotational angle of the mirror around a horizontal rotation axis passing through the center of the light reflection surface; and
   the impedance conversion circuit is configured to receive the first sensor signal.

3. The optical scanning device as claimed in claim 1, wherein
   the piezoelectric sensor comprises
   a first piezoelectric sensor configured to output a first sensor signal corresponding to a rotational angle of the mirror around a vertical rotation axis passing through the center of the light reflection surface, and
   a second piezoelectric sensor configured to output a second sensor signal corresponding to a rotational angle of the mirror around a horizontal rotation axis passing through the center of the light reflection surface; and
   the impedance conversion circuit is configured to receive the first sensor signal and the second sensor signal.

4. The optical scanning device as claimed in claim 1, further comprising:
   a sensor signal wiring board on which the impedance conversion circuit and a sensor signal wiring are formed, the sensor signal wiring being configured to transmit the sensor signal to the impedance conversion circuit; and
   a driving signal wiring board on which a driving signal wiring is formed, the driving signal wiring being configured to transmit the driving signal to the actuator.

5. The optical scanning device as claimed in claim 4, further comprising:
   a connecting board that includes a connector including an output terminal for outputting the impedance-converted sensor signal and a driving terminal for receiving the driving signal, the connecting board being connected between the sensor signal wiring board and the driving signal wiring board;
   a first cable that connects the output terminal to the sensor signal wiring; and
   a second cable that connects the driving terminal to the driving signal wiring.

6. The optical scanning device as claimed in claim 4, wherein the impedance conversion circuit is disposed adjacent to the optical scanner.

7. The optical scanning device as claimed in claim 1, wherein the optical scanner and the impedance conversion circuit are integrated and encapsulated in a single package.

8. A head-up display comprising the optical scanning device of claim 1.

* * * * *